(12) United States Patent
Sakai et al.

(10) Patent No.: US 9,379,301 B2
(45) Date of Patent: Jun. 28, 2016

(54) METHOD FOR MANUFACTURING PIPE-SHAPED THERMAL POWER GENERATION DEVICE

(71) Applicant: Panasonic Corporation, Osaka (JP)

(72) Inventors: Akihiro Sakai, Nara (JP); Tsutomu Kanno, Kyoto (JP); Kohei Takahashi, Osaka (JP); Hiromasa Tamaki, Osaka (JP); Yuka Yamada, Nara (JP)

(73) Assignee: Panasonic Corporation, Osaka (JP)

( * ) Notice: Subject to any disclaimer, the term of this patent is extended or adjusted under 35 U.S.C. 154(b) by 342 days.

(21) Appl. No.: 14/091,880

(22) Filed: Nov. 27, 2013

(65) Prior Publication Data

US 2014/0086781 A1    Mar. 27, 2014

Related U.S. Application Data

(63) Continuation of application No. PCT/JP2013/002259, filed on Apr. 1, 2013.

(30) Foreign Application Priority Data

Apr. 3, 2012  (JP) ................................. 2012-084549

(51) Int. Cl.
*H01L 35/34*    (2006.01)
*H01L 35/32*    (2006.01)

(52) U.S. Cl.
CPC ................ *H01L 35/34* (2013.01); *H01L 35/32* (2013.01)

(58) Field of Classification Search
CPC ....................................................... H01L 35/34
See application file for complete search history.

(56) References Cited

U.S. PATENT DOCUMENTS

| 8,646,310 B2 * | 2/2014 | Takahashi | ............... G01N 25/32 436/144 |
| 2008/0173343 A1 | 7/2008 | Kanno et al. | |
| 2013/0068273 A1 | 3/2013 | Kanno et al. | |

FOREIGN PATENT DOCUMENTS

| JP | 11-068177 A | 3/1999 |
| JP | 2002-246662 A | 8/2002 |
| JP | 2004-319944 A | 11/2004 |
| JP | 2008-078334 A | 4/2008 |
| JP | 2012-033685 A | 2/2012 |
| WO | WO 2012/014366 A1 | 2/2012 |

OTHER PUBLICATIONS

Machine translation of JP 11-068177 (Japanese document published Mar. 1999).*

(Continued)

*Primary Examiner* — Jessee Roe
*Assistant Examiner* — Christopher Kessler
(74) *Attorney, Agent, or Firm* — Renner, Otto, Boisselle & Sklar, LLP

(57) ABSTRACT

A plurality of first cup-shaped members and a plurality of second cup-shaped members are placed alternately in repetition to form a pipe having an inner through-hole. At this point, neither the first cup-shaped members nor the second cup-shaped members are sintered yet. Then, the resultant pipe is sintered to obtain a pipe-shaped thermal power generation device. While the pipe is sintered, a pressure is applied to the pipe along a longitudinal direction of the pipe in a direction in which the pipe is compressed.

2 Claims, 19 Drawing Sheets

(56) References Cited

OTHER PUBLICATIONS

International Search Report for corresponding International Application No. PCT/JP2013/002259 mailed Jun. 18, 2013.

Form PCT/IPEA/408 for corresponding International Application No. PCT/JP2013/002259 dated Oct. 22, 2013 and partial English translation.

* cited by examiner

81

91

METHOD FOR MANUFACTURING PIPE-SHAPED THERMAL POWER GENERATION DEVICE

This is a continuation of International Application No. PCT/JP2013/002259, with an international filing date of Apr. 1, 2013, which claims priority of Japanese Patent Application No. 2012-084549, filed on Apr. 3, 2012, the contents of which are hereby incorporated by reference.

BACKGROUND

1. Technical Field

Present disclosure relates to a method for manufacturing a pipe-shaped thermal power generation device.

2. Description of the Related Art

International Publication No. WO 2012/014366 discloses a pipe-shaped thermal power generation device.

SUMMARY

A non-limiting, illustrative embodiment of present disclosure provides a novel method for manufacturing a pipe-shaped thermal power generation device.

In one general aspect, a method for manufacturing a pipe-shaped thermal power generation device disclosed herein comprises: step (a) of compressing powder of a metal material to provide a first cup-shaped member made of the metal material, wherein: the first cup-shaped member has a first inner surface and a first outer surface, the first cup-shaped member has a first through-hole at a lower end thereof, the first cup-shaped member has a cross-sectional area which decreases toward the lower end thereof, and the first cup-shaped member is not sintered; step (b) of compressing powder of a thermoelectric material to provide a second cup-shaped member made of the thermoelectric material, wherein: the second cup-shaped member has a second inner surface and a second outer surface, the second cup-shaped member has a second through-hole at a lower end thereof, the second cup-shaped member has a cross-sectional area which decreases toward the lower end thereof, and the second cup-shaped member is not sintered; step (c) of alternately placing a plurality of said first cup-shaped members and a plurality of said second cup-shaped members in repetition to form a pipe having an inner through-hole, wherein: each of the plurality of first cup-shaped members is inserted into one second cup-shaped member among two second cup-shaped members adjacent thereto so that the first outer surface of the first cup-shaped member is in close contact with the second inner surface of the one second cup-shaped member, the other second cup-shaped member among the two second cup-shaped members adjacent to the first cup-shaped member is inserted into the first cup-shaped member so that the first inner surface of the first cup-shaped member is in close contact with the second outer surface of the other second cup-shaped member, the inner through-hole is formed by the plurality of first through-holes and the plurality of second through-holes, the first cup-shaped members are not sintered, and the second cup-shaped members are not sintered; and step (d) of sintering the pipe formed in step (c) to obtain the pipe-shaped thermal power generation device, wherein: while the pipe is sintered, a pressure is applied to the pipe along a longitudinal direction of the pipe in a direction in which the pipe is compressed.

According to a non-limiting, illustrative embodiment of present disclosure, a novel method for manufacturing a pipe-shaped thermal power generation device having a high maximum value of the generated power is provided. The pipe-shaped thermal power generation device obtained by the method of present disclosure can have a high maximum value of the generated power.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Figure 1:
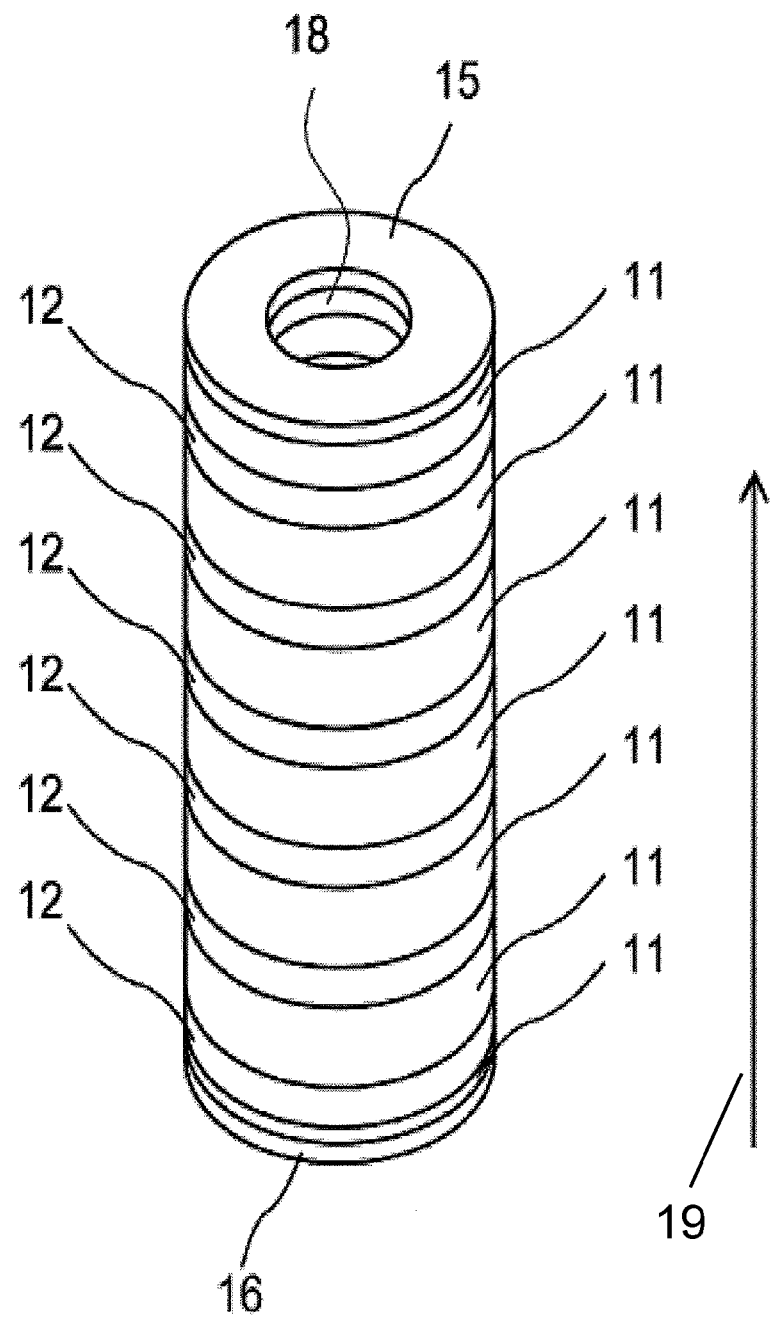
FIG. 1 shows a pipe-shaped thermal power generation device according to an exemplary embodiment.

An overview of an exemplary embodiment of present disclosure is as follows.

A method for manufacturing a pipe-shaped thermal power generation device according to an embodiment comprises: step (a) of compressing powder of a metal material to provide a first cup-shaped member 11 made of the metal material, wherein: the first cup-shaped member 11 has a first inner surface 112 and a first outer surface 111, the first cup-shaped member 11 has a first through-hole 113 at a lower end thereof, the first cup-shaped member 11 has a cross-sectional area which decreases toward the lower end thereof, and the first cup-shaped member 11 is not sintered; step (b) of compressing powder of a thermoelectric material to provide a second cup-shaped member 12 made of the thermoelectric material, wherein: the second cup-shaped member 12 has a second inner surface 122 and a second outer surface 121, the second cup-shaped member 12 has a second through-hole 123 at a lower end thereof, the second cup-shaped member 12 has a cross-sectional area which decreases toward the lower end thereof, and the second cup-shaped member 12 is not sintered; step (c) of alternately placing a plurality of said first cup-shaped members 11 and a plurality of said second cup-shaped members 12 in repetition to form a pipe having an inner through-hole 18, wherein: each of the plurality of first cup-shaped members 11 (11*b*) is inserted into one second cup-shaped member 12*b* among two second cup-shaped members 12 (12*a*, 12*b*) adjacent thereto so that the first outer surface 111*b* of the first cup-shaped member 11*b* is in close contact with the second inner surface 122*b* of the one second cup-shaped member 12*b*, the other second cup-shaped member 12*a* among the two second cup-shaped members 12 (12*a*, 12*b*) adjacent to the first cup-shaped member 11*b* is inserted into the first cup-shaped member 11*b* so that the first inner surface 112*b* of the first cup-shaped member 11*b* is in close contact with the second outer surface 121*a* of the other second cup-shaped member 12*a*, the inner through-hole 18 is formed by the plurality of first through-holes 113 and the plurality of second through-holes 123, the first cup-shaped members 11 are not sintered, and the second cup-shaped members 12 are not sintered; and step (d) of sintering the pipe formed in step (c) to obtain the pipe-shaped thermal power generation device, wherein: while the pipe is sintered, a pressure is applied to the pipe along a longitudinal direction of the pipe in a direction in which the pipe is compressed.

In one embodiment, in step (c): the first outer surface 111*b* of the first cup-shaped member 11*b* is in contact with the second inner surface 122*b* of the one second cup-shaped member 12*b* adjacent to the first cup-shaped member 11*b*; and the first inner surface 112*b* of the first cup-shaped member 11*b* is in contact with the second outer surface 121*a* of the other second cup-shaped member 12*a* adjacent to the first cup-shaped member 11*b*.

In one embodiment, in step (a), the powder of the metal material is compressed by a compression device; and step (a) includes: step (a1) of preparing the compression device, wherein: the compression device includes a central rod 81, a cylindrical outer frame 91, a first cylindrical inner frame 71, and a second cylindrical inner frame 61, the first cylindrical inner frame 71 and the second cylindrical inner frame 61 face each other along a longitudinal direction of the central rod 81, the second cylindrical inner frame 61 is held between the central rod 81 and the cylindrical outer frame 91, an outer surface of the central rod 81 is in contact with an inner surface of the second cylindrical inner frame 61, an inner surface of the cylindrical outer frame 91 is in contact with an outer surface of the second cylindrical inner frame 61, the central rod 81 is longer than the second cylindrical inner frame 61, the cylindrical outer frame 91 is longer than the second cylindrical inner frame 61, as seen in a cross-section of the compression device taken along the longitudinal direction of the central rod 81, one of two ends of the second cylindrical inner frame 61 is inclined, and the one end faces the first cylindrical inner frame 71, as seen in the cross-section of the compression device taken along the longitudinal direction of the central rod 81, one of two ends of the first cylindrical inner frame 71 is inclined, and the one end faces the second cylindrical inner frame 61, such that the one inclined end of the first cylindrical inner frame 71 and the one inclined end of the second cylindrical inner frame 61 are parallel to each other; step (a2) of placing the powder of the metal material at the one end of the second cylindrical inner frame 61 such that the powder of the metal material is held between the central rod 81 and the cylindrical outer frame 91; and step (a3) of inserting the first cylindrical inner frame 71 into a space between the central rod 81 and the cylindrical outer frame 91 along the longitudinal direction of the central rod 81 to compress the powder of the metal material between the first cylindrical inner frame 71 and the second cylindrical inner frame 61.

In one embodiment, in step (b), the powder of the thermoelectric material is compressed by a compression device; and step (b) includes: step (b1) of preparing the compression device, wherein: the compression device includes a central rod 81, a cylindrical outer frame 91, a first cylindrical inner frame 71, and a second cylindrical inner frame 61, the first cylindrical inner frame 71 and the second cylindrical inner frame 61 face each other along a longitudinal direction of the central rod 81, the second cylindrical inner frame 61 is held between the central rod 81 and the cylindrical outer frame 91, an outer surface of the central rod 81 is in contact with an inner surface of the second cylindrical inner frame 61, an inner surface of the cylindrical outer frame 91 is in contact with an outer surface of the second cylindrical inner frame 61, the central rod 81 is longer than the second cylindrical inner frame 61, the cylindrical outer frame 91 is longer than the second cylindrical inner frame 61, as seen in a cross-section of the compression device taken along the longitudinal direction of the central rod 81, one of two ends of the second cylindrical inner frame 61 is inclined, and the one end faces the first cylindrical inner frame 71, as seen in the cross-section of the compression device taken along the longitudinal direction of the central rod 81, one of two ends of the first cylindrical inner frame 71 is inclined, and the one end faces the second cylindrical inner frame 61, such that the one inclined end of the first cylindrical inner frame 71 and the one inclined end of the second cylindrical inner frame 61 are parallel to each other; step (b2) of placing the powder of the thermoelectric material at the one end of the second cylindrical inner frame 61 such that the powder of the thermoelectric material is held between the central rod 81 and the cylindrical outer frame 91; and step (b3) of inserting the first cylindrical inner frame 71 into a space between the central rod 81 and the cylindrical outer frame 91 along the longitudinal direction of the central rod 81 to compress the powder of the thermoelectric material between the first cylindrical inner frame 71 and the second cylindrical inner frame 61.

Hereinafter, embodiments of present disclosure will be described with reference to the drawings. Note however that unnecessarily detailed descriptions may be omitted. For example, detailed descriptions on what are well known in the art or redundant descriptions on substantially the same configurations may be omitted. This is to prevent the following description from becoming unnecessarily redundant, to make it easier for a person of ordinary skill in the art to understand.

Note that the present inventors provide the accompanying drawings and the following description in order for a person of ordinary skill in the art to sufficiently understand the present disclosure, and they are not intended to limit the subject matter set forth in the claims.

Embodiment 1

First, a pipe-shaped thermal power generation device will be described.

Hereinafter, an embodiment of this disclosure will be described.

FIG. 1 shows a pipe-shaped thermal power generation device according to an exemplary embodiment.

The pipe-shaped thermal power generation device includes an inner through-hole 18, a plurality of first cup-shaped members 11, a plurality of second cup-shaped members 12, a first electrode 15, and a second electrode 16.

The inner through-hole 18 is provided along an axial direction of the pipe-shaped thermal power generation device. The axial direction is depicted by the arrow 19 shown in FIG. 1.

The first electrode 15 and the second electrode 16 are respectively located at one end and the other end of the pipe-shaped thermal power generation device.

The first cup-shaped members 11 are made of a metal material. An example of the metal material is nickel, cobalt, copper, aluminum, silver, gold or an alloy thereof. It is beneficial that the metal material is nickel, cobalt, copper or aluminum.

The second cup-shaped members 12 are made of a thermoelectric material. An example of the thermoelectric material is Bi, $Bi_2Te_3$ or PbTe. $Bi_2Te_3$ may contain Sb or Se.

Figure 2:
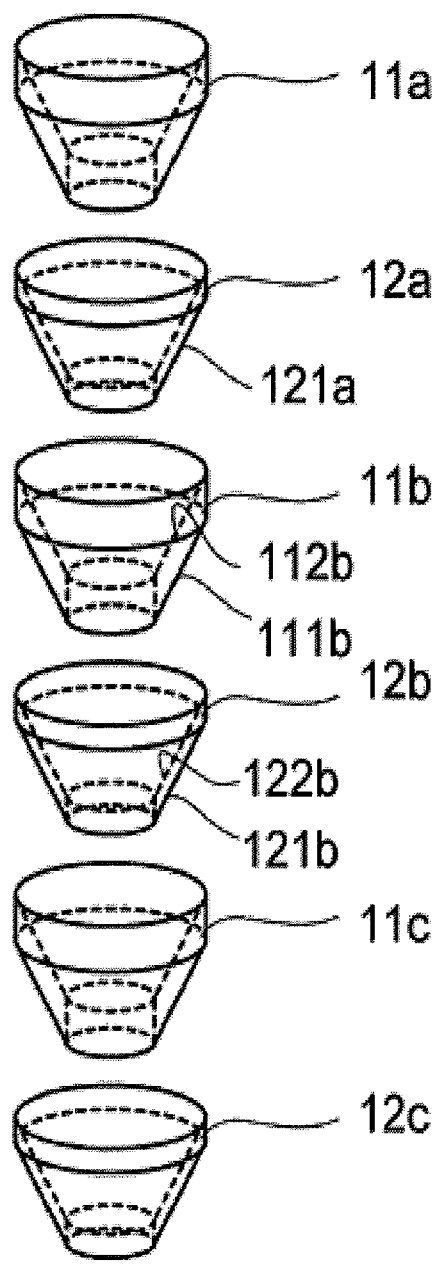
FIG. 2 is a partial exploded view of a pipe-shaped thermal power generation device according to an exemplary embodiment.

FIG. 2 is a partial exploded view of the pipe-shaped thermal power generation device according to an exemplary embodiment. As shown in FIG. 2, three first cup-shaped members 11a through 11c and three second cup-shaped members 12a through 12c are placed alternately in repetition along the axial direction. The first cup-shaped members 11a through 11c (11) have the same shape as one another, and the second cup-shaped members 12a through 12c (12) have the same shape as one another.

Figure 3:
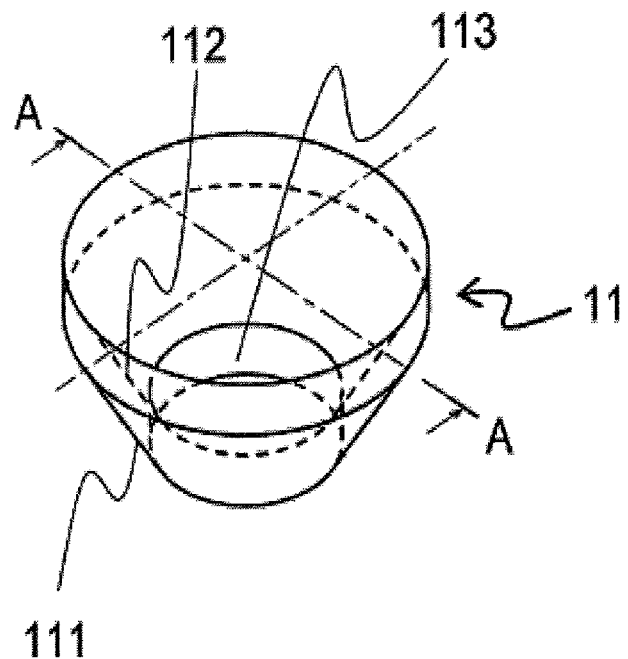
FIG. 3 shows one of first cup-shaped members 11.
Figure 4:
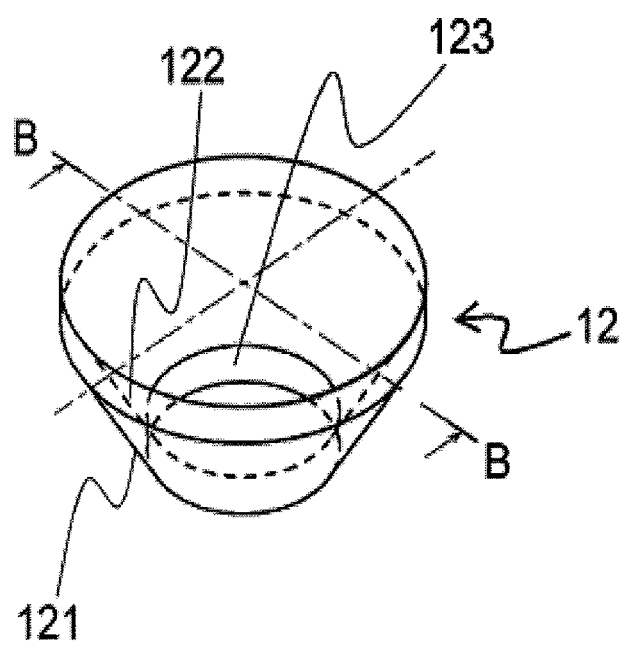
FIG. 4 shows one of second cup-shaped members 12.

FIG. 3 shows one of first cup-shaped members 11. As shown in FIG. 3, the first cup-shaped member 11 has a first inner surface 112 and a first outer surface 111. The first cup-shaped member 11 has a first through-hole 113 at a lower end thereof. An upper end of the cup-shaped member 11 has an opening. The first cup-shaped member 11 has a cross-sectional area which decreases toward the lower end thereof. FIG. 4 shows one of second cup-shaped members 12. As shown in FIG. 4, like the first cup-shaped member 11, the second cup-shaped member 12 has a second inner surface 122, a second outer surface 121, and a second through-hole 123. The second cup-shaped member 12 also has a cross-sectional area which decreases toward a lower end thereof.

As is clear from FIG. 1 through FIG. 4, the inner through-hole 18 is formed by the plurality of first through-holes 113 and the plurality of second through-holes 123.

As shown in FIG. 2, the first cup-shaped member 11b is inserted into the second cup-shaped member 12b, which is one of two second cup-shaped members 12 adjacent thereto, so that the first outer surface 111b of the first cup-shaped member 11b is in close contact with the second inner surface 122b of the second cup-shaped member 12b.

The other second cup-shaped member 12a, among the two second cup-shaped members 12 adjacent to the first cup-shaped member 11b, is inserted into the first cup-shaped member 11b so that the first inner surface 112b of the first cup-shaped member 11b is in close contact with the second outer surface 121a of the second cup-shaped member 12a.

In this manner, one first cup-shaped member 11 is in close contact with two second cup-shaped members 12 adjacent thereto. Similarly, one second cup-shaped member 12 is also in close contact with two first cup-shaped members 11 adjacent thereto.

Typically, the first outer surface 111b of the first cup-shaped member 11b is in contact with the second inner surface 122b of the second cup-shaped member 12b, which is one of the two second cup-shaped members 12 adjacent thereto. Alternatively, the first outer surface 111b of the first cup-shaped member 11b and the second inner surface 122b of the second cup-shaped member 12b, which is one of the two second cup-shaped members 12 adjacent thereto, may be bonded to each other by solder provided between the first outer surface 111b and the second inner surface 122b.

Similarly to the above, typically, the first inner surface 112b of the first cup-shaped member 11b is in contact with the second outer surface 121a of the other second cup-shaped member 12a, among the two second cup-shaped members 12 adjacent to the first cup-shaped member 11b. Alternatively, these surfaces may be bonded to each other by solder provided between these surfaces.

Typically, there is no gap between the first cup-shaped members 11 and the second cup-shaped members 12. A reason for this is that, as described later, when a fluid flows in the inner through-hole 18, such a gap may possibly inhibit the thermoelectric conversion. In addition, the fluid may possibly flow out through the gap. As necessary, solder may be provided to fill such a gap as described above.

The first cup-shaped members 11 and the second cup-shaped members 12 are each provided in a number of, for example, 100 to 1000.

Figure 5:
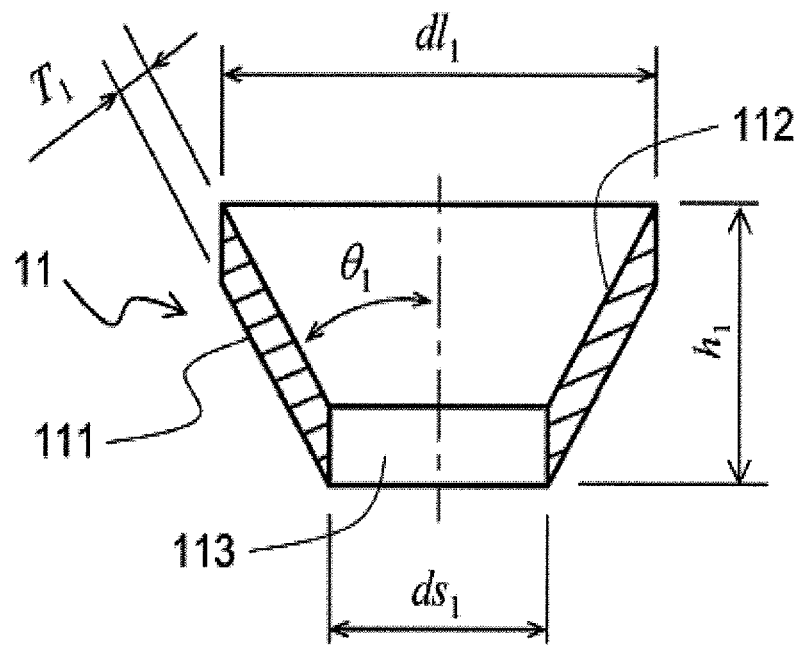
FIG. 5 is a cross-sectional view taken along line A-A in FIG. 3.
Figure 6:
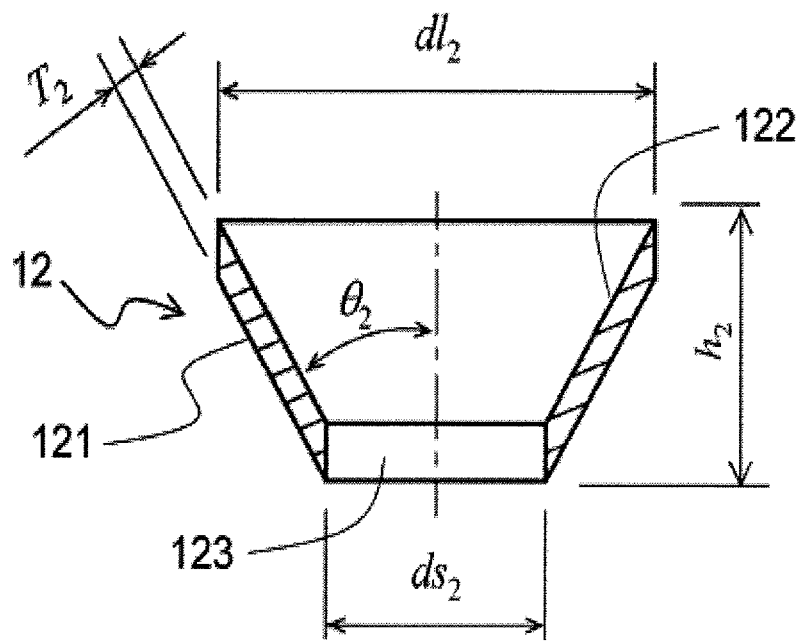
FIG. 6 is a cross-sectional view taken along line B-B in FIG. 4.

FIG. 5 is a cross-sectional view taken along line A-A in FIG. 3. FIG. 6 is a cross-sectional view taken along line B-B in FIG. 4. $\theta_1$ and $\theta_2$ respectively represent inclining angles of the first cup-shaped member 11 and the second cup-shaped member 12. Specifically, $\theta_1$ represents an angle made by the inclining side of the first cup-shaped member 11, which decreases in cross-sectional area toward the lower end thereof, and the axial direction of the first cup-shaped member 11. Similarly, $\theta_2$ represents an angle made by the inclining side of the second cup-shaped member 12, which decreases in cross-sectional area toward the lower end thereof, and the axial direction of the second cup-shaped member 12. The value of $\theta_1$ is equal to the value of $\theta_2$. The values of $\theta_1$ and $\theta_2$ are appropriately adjusted in accordance with the materials of the first cup-shaped member 11 and the second cup-shaped member 12. Typically, the values of $\theta_1$ and $\theta_2$ are each equal to or greater than 5 degrees and equal to or less than 45 degrees.

There is no specific limitation on the cross-sectional shape of the inner through-hole 18. There is no specific limitation on the cross-sectional shape of the pipe-shaped thermal power generation device.

In the case where the first cup-shaped member 11 has a circular cross-section, $dl_1$ and $ds_1$ shown in FIG. 5 respectively represent the width of an upper end and the width of a lower end of the first cup-shaped member 11 in cross-section. The first cup-shaped member 11 has a height $h_1$ and a thickness $T_1$. Similar to FIG. 5, $dl_2$ and $ds_2$ shown in FIG. 6 respectively represent the width of an upper end and the width of a lower end of the second cup-shaped member 12 in cross-section, and the second cup-shaped member 12 has a height $h_2$ and a thickness $T_2$.

There is no specific limitation on the cross-sectional shape of the pipe-shaped thermal power generation device. The pipe-shaped thermal power generation device may have, for example, a circular, an elliptical, or a polygonal cross-section. Typically, the pipe-shaped thermal power generation device has a circular cross-section. Namely, the pipe-shaped thermal power generation device is typically cylindrical.

Figure 7:
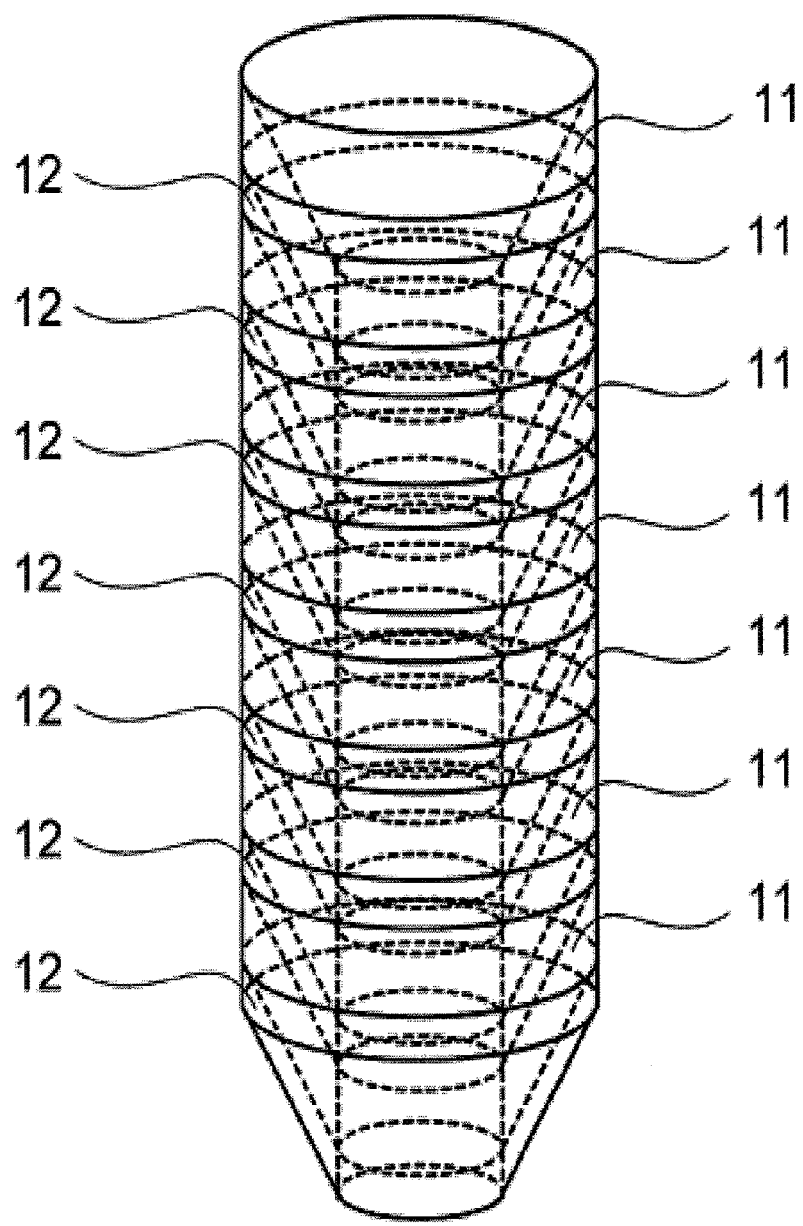
FIG. 7 shows a step in a method for manufacturing a pipe-shaped thermal power generation device according to an exemplary embodiment.
Figure 8:
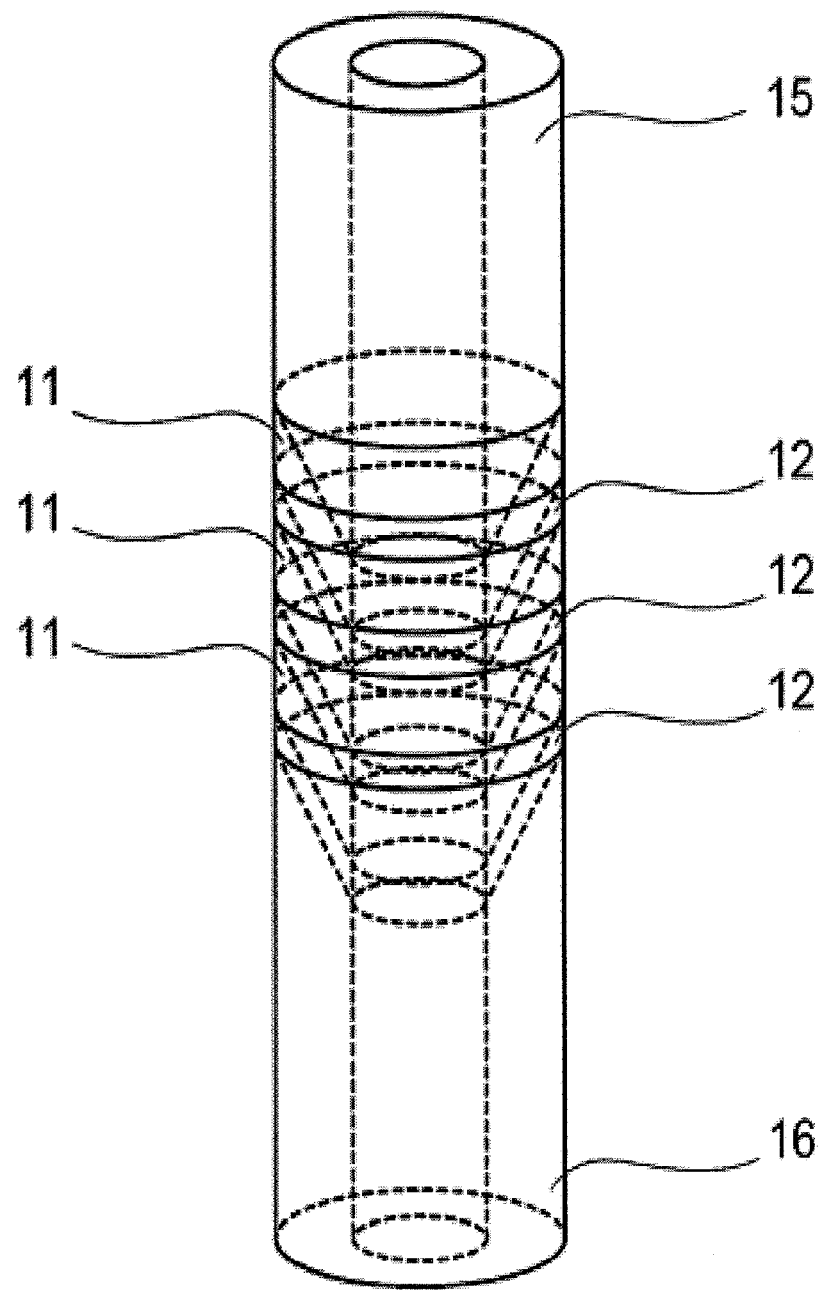
FIG. 8 shows a step in a method for manufacturing a pipe-shaped thermal power generation device which is subsequent to the step shown in FIG. 7.
Figure 9:
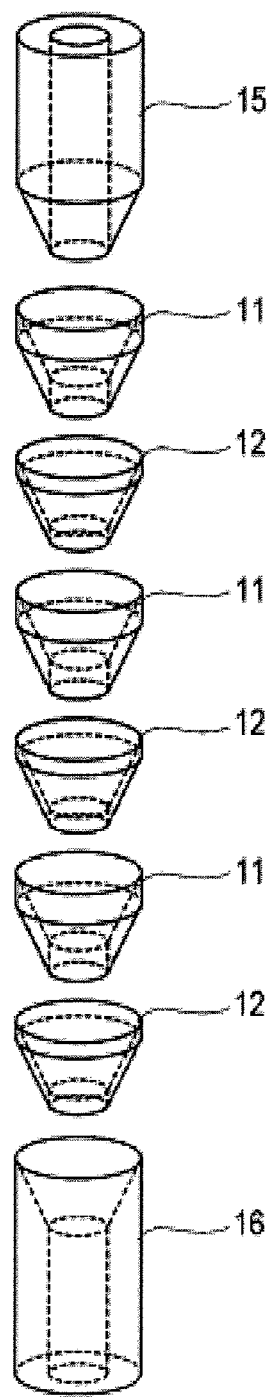
FIG. 9 is an exploded view of the pipe-shaped thermal power generation device shown in FIG. 8.

As shown in FIG. 7, the plurality of first cup-shaped members 11 and the plurality of second cup-shaped members 12 are placed alternately in repetition. Then, as shown in FIG. 8 and FIG. 9, the first electrode 15 and the second electrode 16 are respectively joined to one end and the other end of the stack of the first cup-shaped members 11 and the second cup-shaped members 12. Thus, the pipe-shaped thermal power generation device is obtained. FIG. 9 is an exploded view of the pipe-shaped thermal power generation device shown in FIG. 8.

Figure 10:
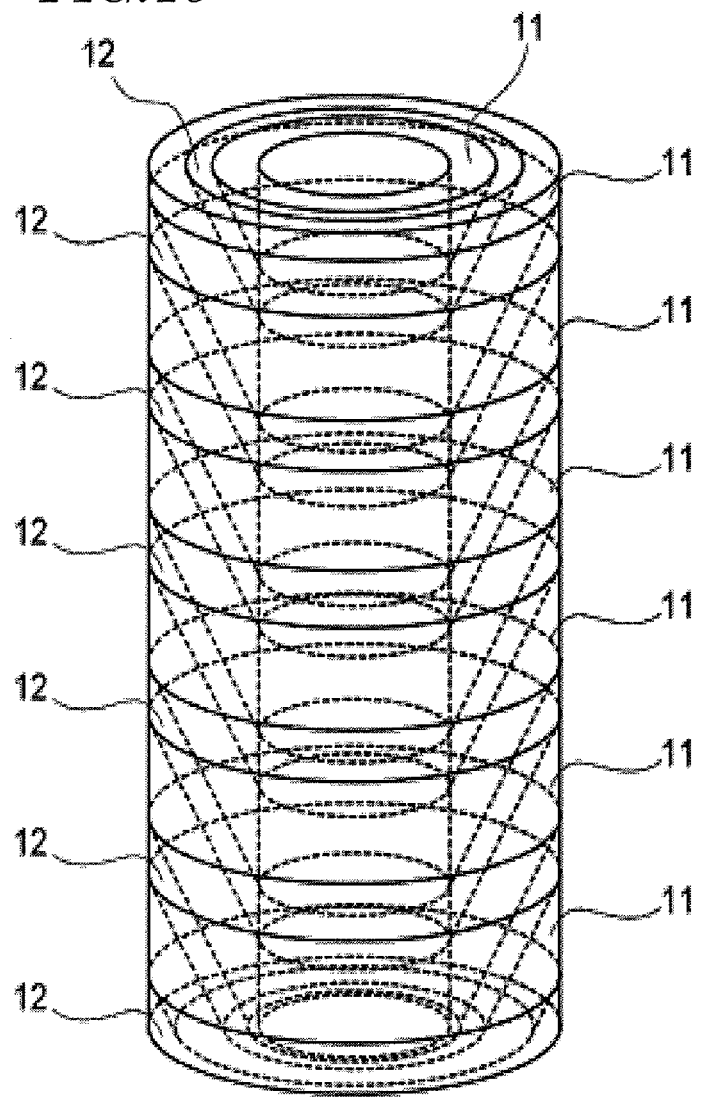
FIG. 10 shows a step in another method for manufacturing a pipe-shaped thermal power generation device.
Figure 11:
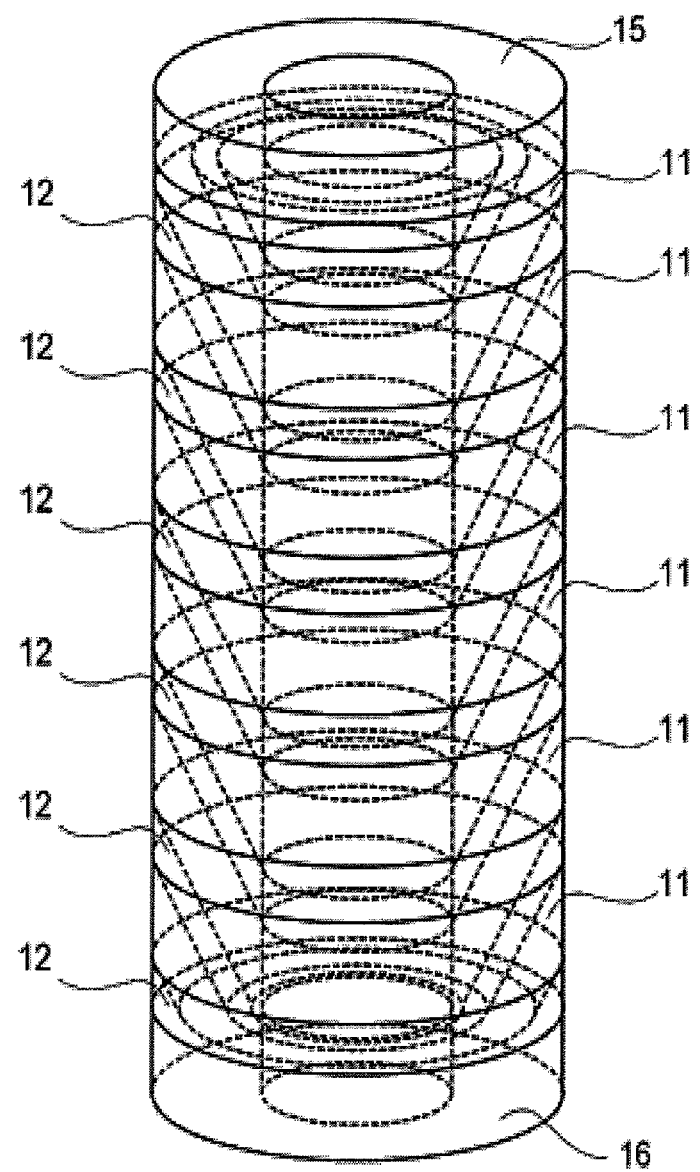
FIG. 11 shows a step in another method for manufacturing a pipe-shaped thermal power generation device which is subsequent to the step shown in FIG. 10.

The first electrode 15 and the second electrode 16 may be joined as follows instead of by the procedure shown in FIG. 8 and FIG. 9. The first cup-shaped members 11 and the second cup-shaped members 12 are arranged as shown in FIG. 7. After this, as shown in FIG. 10, one end and the other end of the stack of the first cup-shaped members 11 and the second cup-shaped members 12 are partially cut and flattened. Then, as shown in FIG. 11, a plate-like first electrode 15 and a plate-like second electrode 16 are respectively joined to the one end and the other end of the stack. Thus, the pipe-shaped thermal power generation device can be obtained.

Figure 12:
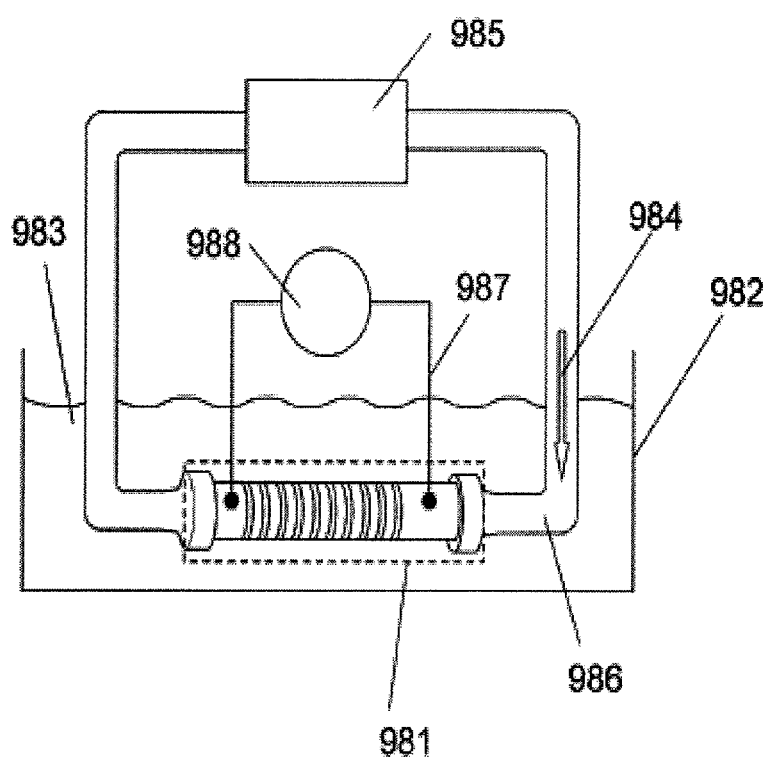
FIG. 12 shows a method for generating power by use of a pipe-shaped thermal power generation device according to an exemplary embodiment.
Figure 13:
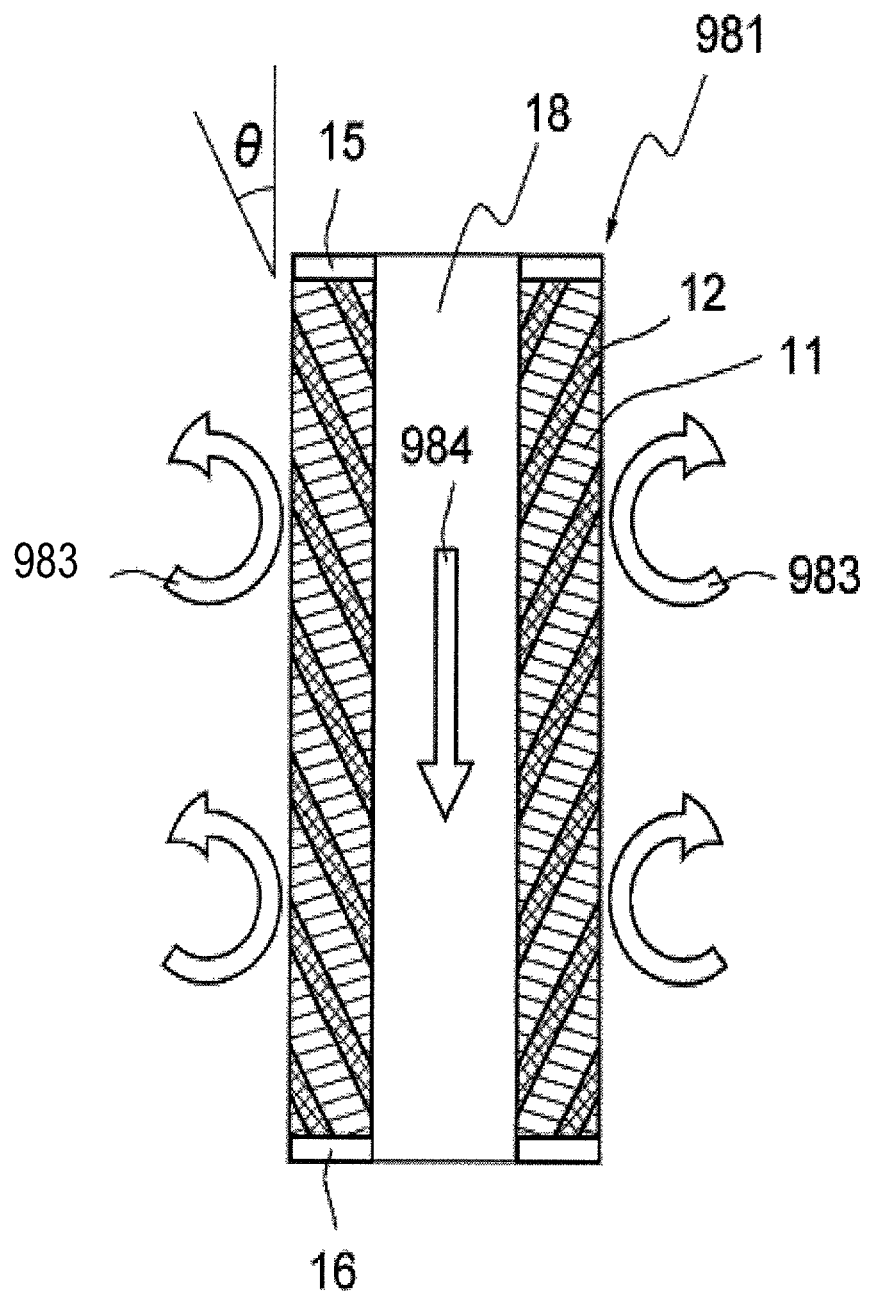
FIG. 13 is a cross-sectional view of the pipe-shaped thermal power generation device shown in FIG. 12.

Hereinafter, a method for generating power by use of a pipe-shaped thermal power generation device will be described with reference to FIG. 12 and FIG. 13. FIG. 12 shows an example of method for generating power by use of a pipe-shaped thermal power generation device according to an exemplary embodiment. FIG. 13 is a cross-sectional view of the pipe-shaped thermal power generation device shown in FIG. 12.

As shown in FIG. 12, a pipe-shaped thermal power generation device 981 is immersed in a cold fluid 983 stored in a tank 982. The cold fluid 983 is typically a liquid such as water or the like. As shown in FIG. 13, for example, a hot fluid 984 flows in the inner through-hole 18. The hot fluid 984 is typically a liquid such as hot water or the like. The hot fluid 984 may be circulated by a pump 985. The pump 985 and the pipe-shaped thermal power generation device 981 are connected to each other by, for example, two silicone tubes 986. In this manner, a voltage difference is caused between the first electrode 15 and the second electrode 16. In FIG. 12, a load 988 is electrically connected to the first electrode 15 and the second electrode 16 via two electric cords 987. A temperature difference between the cold fluid 983 and the hot fluid 984 is typically equal to or greater than 20° C. and equal to or less than 80° C. Alternatively, the hot fluid may be stored in the tank 982, whereas the cold fluid may be circulated in the inner through-hole 18 by the pump 985.

Figure 14:
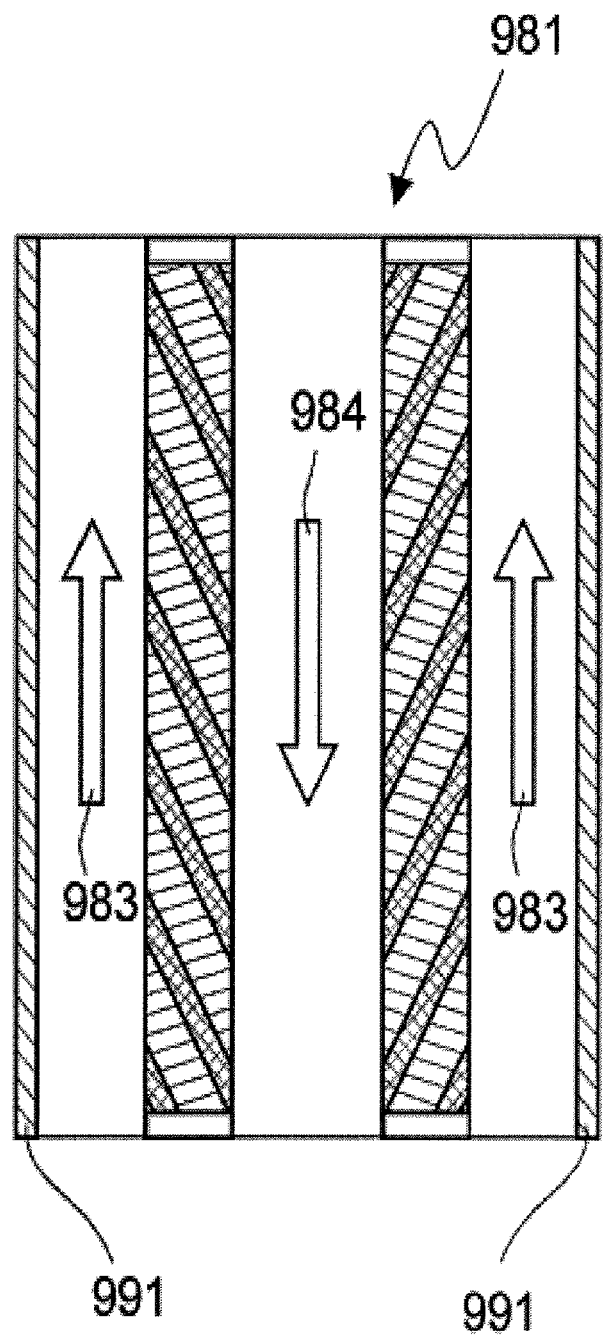
FIG. 14 is a cross-sectional view of a pipe-shaped thermal power generation device 981 taken along an axial direction thereof.
Figure 15:
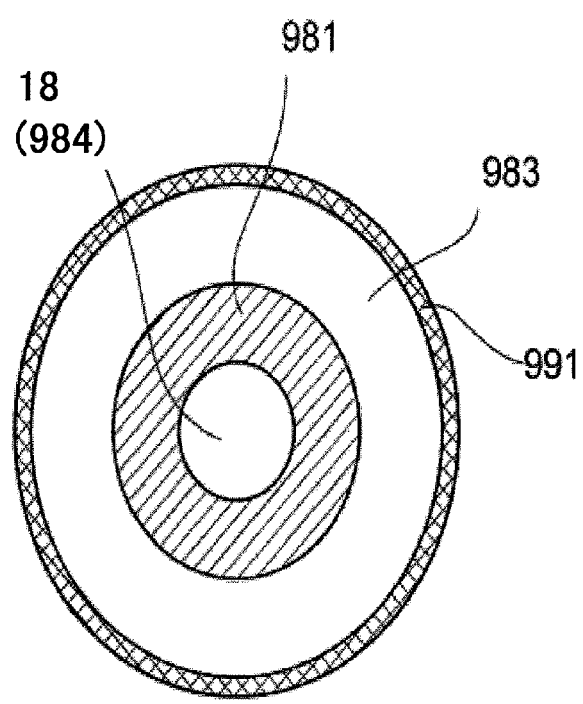
FIG. 15 is a cross-sectional view of a pipe-shaped thermal power generation device 981 taken along a direction perpendicular to the axial direction thereof.

As shown in FIG. 14 and FIG. 15, the pipe-shaped thermal power generation device 981 may be inserted into a tubular jacket 991. The cold fluid 983 may flow between the tubular jacket 991 and the pipe-shaped thermal power generation device 981, and the hot fluid 984 may flow in the inner through-hole 18. Alternatively, the hot fluid may flow between the tubular jacket 991 and the pipe-shaped thermal power generation device 981, and the cold fluid may flow in the inner through-hole 18. An example of the material of the jacket 991 is stainless steel, aluminum, titanium, Hastelloy (registered trademark) or Inconel (registered trademark).

Figure 16:
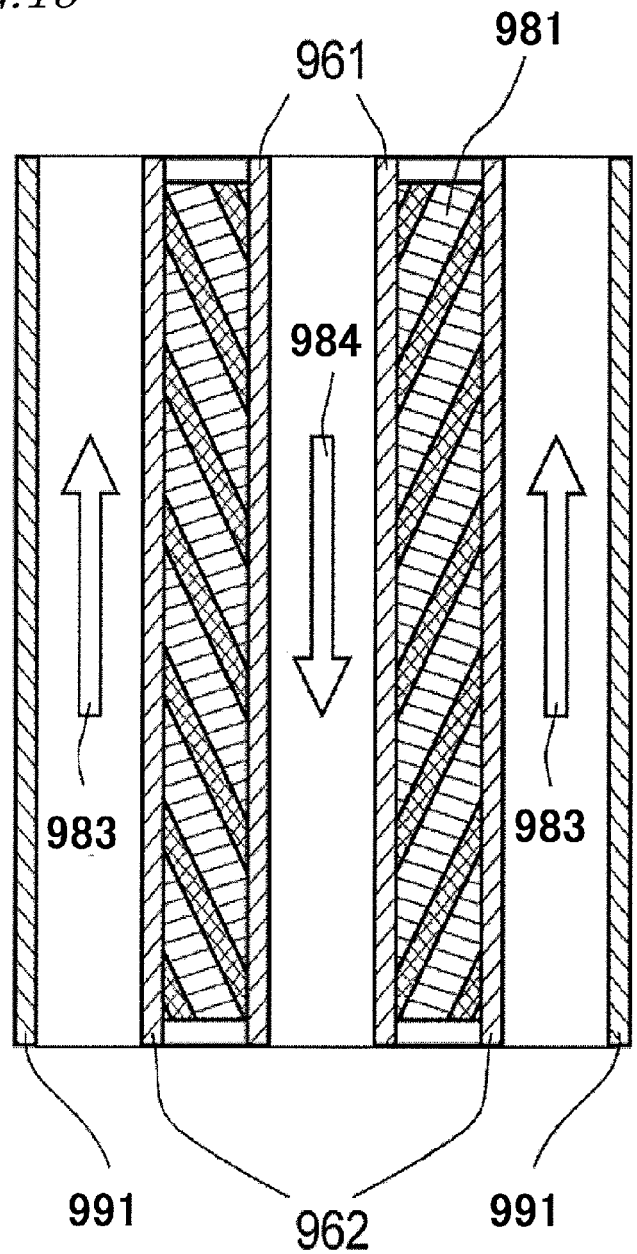
FIG. 16 is a cross-sectional view of a pipe-shaped thermal power generation device 981 taken along the axial direction thereof.
Figure 17:
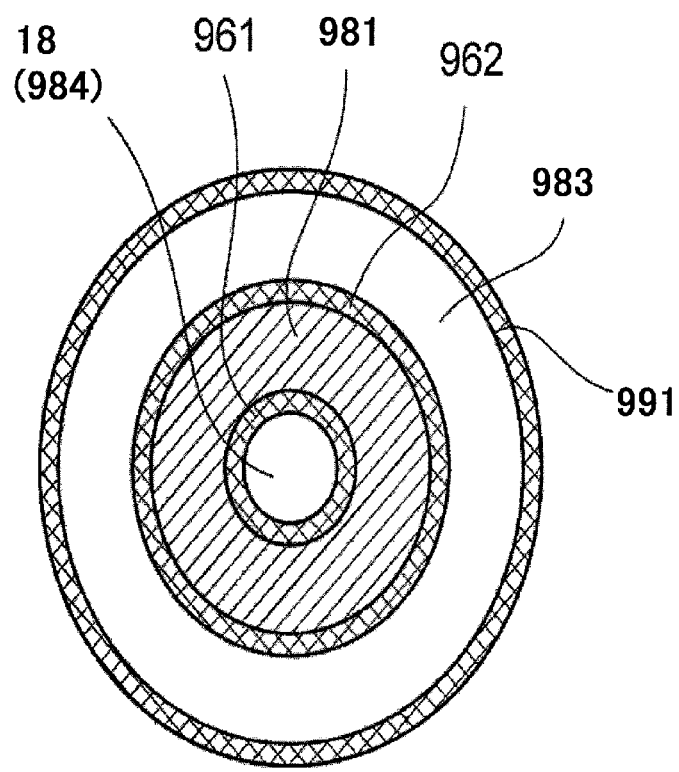
FIG. 17 is a cross-sectional view of a pipe-shaped thermal power generation device 981 taken along the direction perpendicular to the axial direction thereof.
Figure 18:
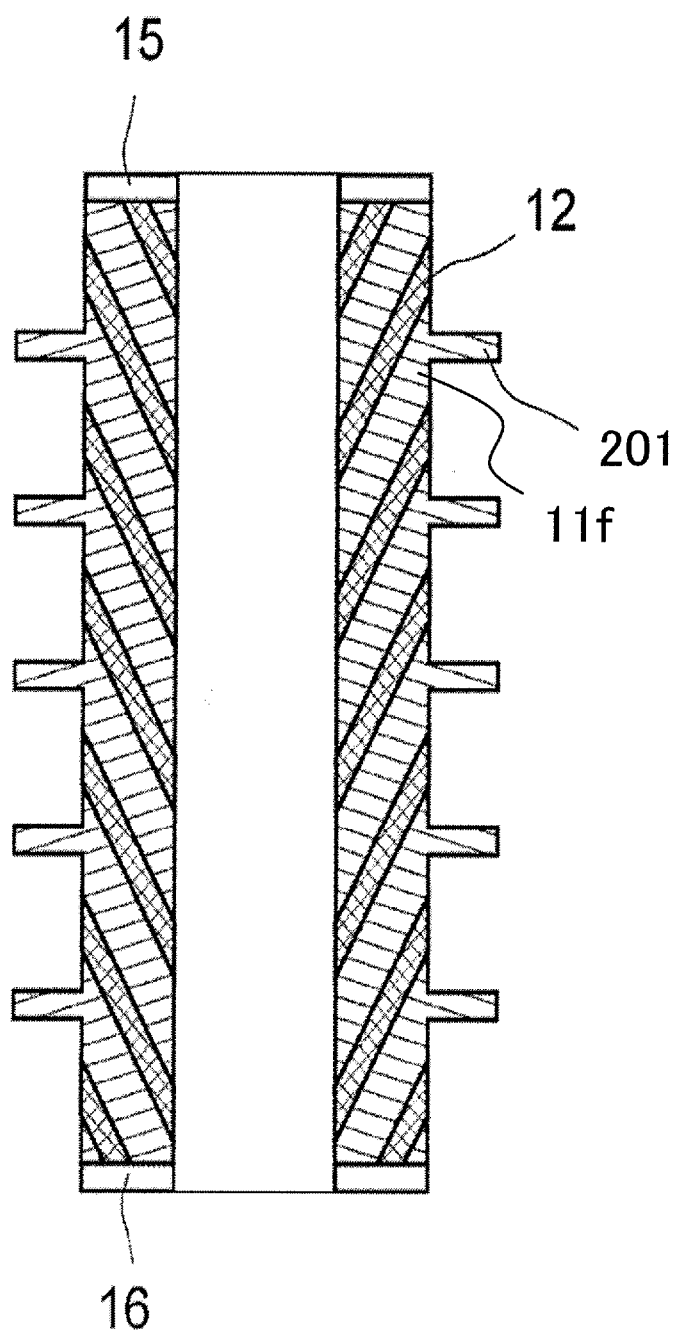
FIG. 18 is a cross-sectional view of a pipe-shaped thermal power generation device 981 taken along the axial direction thereof.

It is beneficial that as shown in FIG. 16 and FIG. 17, the inner through-hole 18 is covered with an insulating inner wall 961, so that the pipe-shaped thermal power generation device 981 is protected against a corroding component such as an acid, alkali or salt which may be contained in the fluid. An example of the material of the inner wall 961 is an inorganic material such as aluminum oxide, aluminum nitride, silicon oxide, silicon nitride or the like, or an organic material such as polyimide resin, fluorine resin or the like. The inner wall 961 may be made of a metal material covered with an insulating material.

Similarly, it is beneficial that the pipe-shaped thermal power generation device 981 has an insulating outer wall 962 around its outer surface. The outer wall 962 may be made of, for example, the same material as that of the inner wall 961.

Now, a method for manufacturing the pipe-shaped thermal power generation device in Embodiment 1 will be described.

Step (a) and Step (b)

First, in step (a) and step (b), powder of a metal material and powder of a thermoelectric material are compressed to form the first cup-shaped members 11 and the second cup-shaped members 12, respectively. The powder of the metal material and the powder of the thermoelectric material are compressed by, for example, a compression device. In step (a) and step (b), the same compression device may be used.

Figure 19:
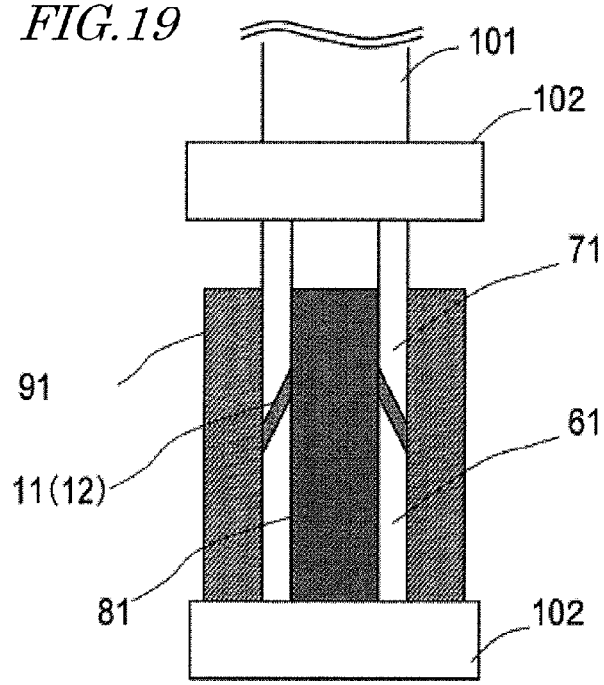
FIG. 19 shows a compression device usable in an exemplary embodiment.

FIG. 19 shows such a compression device.

Figure 20:
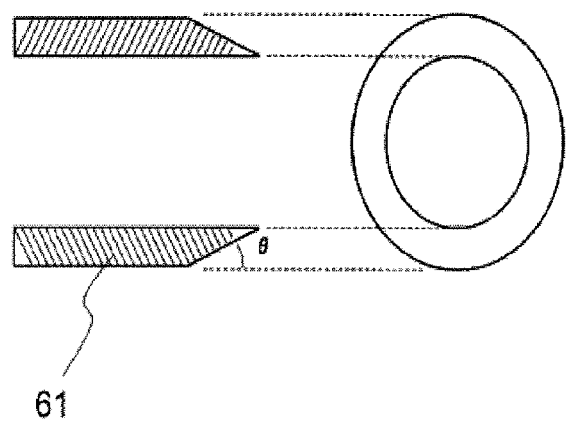
FIG. 20 shows a cross-sectional view and a top view of a second cylindrical inner frame 61.
Figure 21:
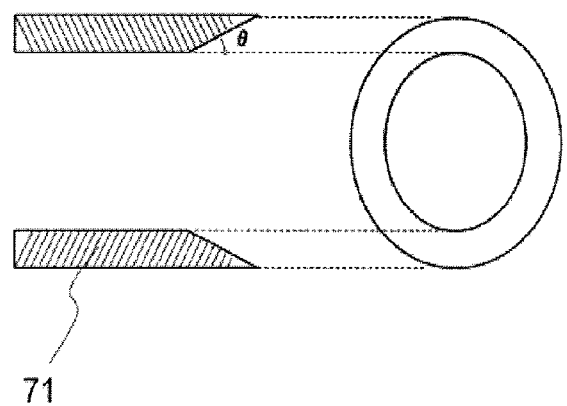
FIG. 21 shows a cross-sectional view and a top view of a first cylindrical inner frame 71.
Figure 22:
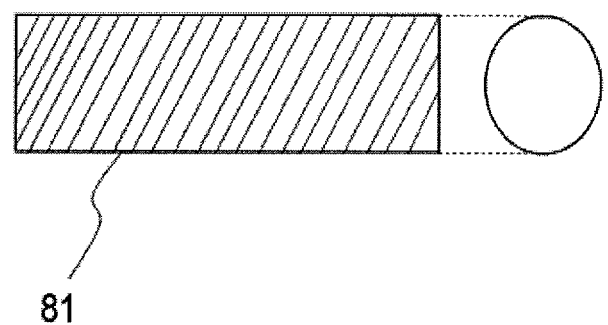
FIG. 22 shows a cross-sectional view and a top view of a central rod 81.
Figure 23:
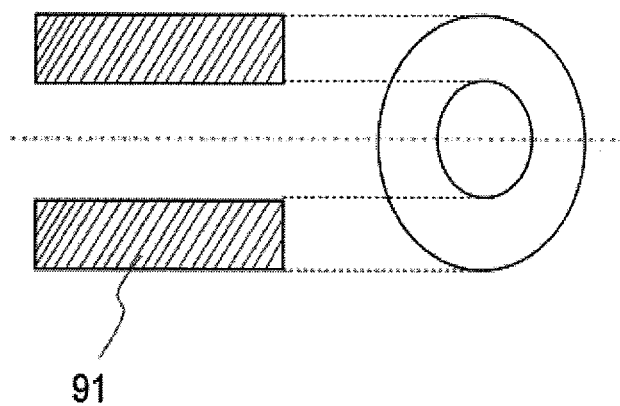
FIG. 23 shows a cross-sectional view and a top view of a cylindrical outer frame 91.

As shown in FIG. 19, the compression device includes a central rod 81, a cylindrical outer frame 91, a first cylindrical inner frame 71, and a second cylindrical inner frame 61. FIG. 20 shows a cross-sectional view and a top view of the second cylindrical inner frame 61. FIG. 21 shows a cross-sectional view and a top view of the first cylindrical inner frame 71. FIG. 22 shows a cross-sectional view and a top view of the central rod 81. FIG. 23 shows a cross-sectional view and a top view of the cylindrical outer frame 91.

As shown in FIG. 19, the first cylindrical inner frame 71 and the second cylindrical inner frame 61 face each other along a longitudinal direction of the central rod 81. The second cylindrical inner frame 61 is held between the central rod 81 and the cylindrical outer frame 91. An outer surface of the central rod 81 is in contact with an inner surface of the second cylindrical inner frame 61. An inner surface of the cylindrical outer frame 91 is in contact with an outer surface of the second cylindrical inner frame 61.

The central rod 81 is longer than the second cylindrical inner frame 61. In other words, the central rod has a height greater than a height of the second cylindrical inner frame 61.

The cylindrical outer frame 91 is longer than the second cylindrical inner frame 61. In other words, the cylindrical outer frame 91 has a height greater than the height of the second cylindrical inner frame 61.

An upper end of the second cylindrical inner frame 61 is inclined at an angle of θ. A lower end of the first cylindrical inner frame 71 is inclined. The upper end and the lower end face each other and are parallel to each other.

A spacer 102 is provided to support a bottom surface of the central rod 81, a bottom surface of the second cylindrical inner frame 61, and a bottom surface of the cylindrical outer frame 91.

The first cylindrical inner frame 71 is attached to a pressurizing section 101 while having another spacer 102 therebetween.

The pressurizing section 101 is driven along the longitudinal direction of the central rod 81 to move the first cylindrical inner frame 71, attached to one end thereof, along the longitudinal direction of the central rod 81. A hydraulic pressing technique is employed to drive the pressurizing section 101, for example.

Next, powder is placed at the upper end of the second cylindrical inner frame 61. The powder is either the powder of a metal material or the powder of a thermoelectric material. Needless to say, the powder of the metal material (or the powder of the thermoelectric material) is held between the central rod 81 and the cylindrical outer frame 91. In this state, the first cylindrical inner frame 71 is not yet inserted into a space between the central rod 81 and the cylindrical outer frame 91.

Then, as shown in FIG. 19, the pressurizing section 101 is driven to insert the first cylindrical inner frame 71 into a space between the central rod 81 and the cylindrical outer frame 91 along the longitudinal direction of the central rod 81. In this manner, the powder is compressed between the first cylindrical inner frame 71 and the second cylindrical inner frame 61 to obtain the first cup-shaped member 11 made of a metal material or the second cup-shaped member 12 made of a thermoelectric material.

In order to improve the strength of the first cup-shaped member 11, it is beneficial that particles of the powder of the metal material have a size of equal to or greater than 1 μm and equal to or less than 20 μm. Similarly, in order to improve the strength of the second cup-shaped member 12, it is beneficial that particles of the powder of the thermoelectric material have a size of equal to or greater than 1 μm and equal to or less than 20 μm. It should be noted that the above-described ranges of the particle size may vary according to the hardness, shape or the like of the powder (powder of the metal material or the powder of the thermoelectric material). The particle size of the powder does not need to be in the above-described ranges as long as the powder can be molded into a shape of a cup.

There no specific limitation on the materials of the central rod 81, the cylindrical outer frame 91, the first cylindrical inner frame 71, the second cylindrical inner frame 61, and the spacers 102. From the viewpoint of the resistance against a high pressure, the central rod 81, the cylindrical outer frame 91, the first cylindrical inner frame 71, the second cylindrical inner frame 61, and the spacers 102 are made of, for example, graphite or stainless steel.

Step (c)

Next, as shown in FIG. 2, the plurality of first cup-shaped members 11 and the plurality of second cup-shaped members 12 are placed alternately in repetition to form a pipe having the inner through-hole 18.

For example, the first cup-shaped member 11b is inserted into the second cup-shaped member 12b, which is one of the two second cup-shaped members 12 adjacent thereto, so that the first outer surface 111b of the first cup-shaped member 11b is in close contact with the second inner surface 122b of the second cup-shaped member 12b.

For example, the other second cup-shaped member 12a, among the two second cup-shaped members 12 adjacent to the first cup-shaped member 11b, is inserted into the first cup-shaped member 11b so that the first inner surface 112b of the first cup-shaped member 11b is in close contact with the second outer surface 121a of the other second cup-shaped member 12a.

The inner through-hole 18 is formed by the plurality of first through-holes 113 and the plurality of second through-holes 123.

In step (c), neither the first cup-shaped members 11 nor the second cup-shaped members 12 are yet sintered. As is clear from Comparative examples 1 and 2 described later, it is beneficial that neither the first cup-shaped members 11 nor the second cup-shaped members 12 are sintered before the pipe is treated in step (d). In the case where the sintered first cup-shaped members 11 and second cup-shaped members 12 are treated in step (d), the maximum value of the generated power is lowered. This may be considered as a characterizing feature of present disclosure.

In step (c), the central rod 81 may be used to place the plurality of first cup-shaped members 11 and the plurality of second cup-shaped members 12 alternately in repetition. More particularly, the compression device shown in FIG. 19 may be used to place the plurality of first cup-shaped members 11 and the plurality of second cup-shaped members 12 alternately in repetition. In the case where the compression device shown in FIG. 19 is used, carbon sheet, for example, is held between the pipe and the central rod 81, and thus the pipe and the central rod 81 are prevented from being adhered to each other. Similarly, carbon sheet, for example, may be held between the pipe and the cylindrical outer frame 91. Instead of the carbon sheet, carbon felt, graphite sheet or carbon powder may be used.

Step (d)

In a final step, the pipe obtained in step (c) is sintered. The sintering temperature is typically equal to or greater than 200° C. and equal to or less than 750° C. Technique (a) or (b) below can be employed to sinter the pipe, for example:

(a) hot pressing technique of applying a pressure to the pipe in vacuum while heating the pipe; or (b) spark plasma sintering technique of applying a pressure to the pipe while heating the pipe by applying a voltage to the pipe.

The compression device shown in FIG. 19 can be used to sinter the pipe. In other words, in the compression device shown in FIG. 19, the pipe is heated and thus sintered while being pressurized.

While the pipe is sintered in step (d), a pressure is applied to the pipe. The pressure is applied along the longitudinal direction of the pipe in a direction in which the pipe is compressed. In step (d), for example, the compression device shown in FIG. 19 is used. It is beneficial that the pressure applied to the pipe is equal to or greater than 1 kN and equal to or less than 9 kN.

The pipe is typically sintered in vacuum.

EXAMPLES

The following examples will describe present disclosure in more detail.

Example 1

The first cup-shaped members 11 and the second cup-shaped members 12 were obtained by use of the compression device shown in FIG. 19. Table 1 shows the details of the first cup-shaped members 11 and the second cup-shaped members 12 in Example 1.

TABLE 1

| | |
|---|---|
| Material of the first cup-shaped members 11 | Nickel |
| Number of the first cup-shaped members 11 | 8 |
| Particle size of the raw material powder | 4 μm |
| Pressure applied to the raw material powder to obtain the first cup-shaped members 11 | 11 kN |
| $dl_1$ | 14 mm |
| $ds_1$ | 10 mm |
| $h_1$ | 6.4 mm |

TABLE 1-continued

| | |
|---|---|
| $\theta_1$ | 30 degrees |
| Material of the second cup-shaped members 12 | $Bi_{0.5}Sb_{1.5}Te_3$ |
| Number of the second cup-shaped members 12 | 7 |
| $dl_2$ | 14 mm |
| Particle size of the raw material powder | 75 μm |
| Pressure applied to the material powder to obtain the second cup-shaped members 12 | 11 kN |
| $ds_2$ | 10 mm |
| $h_2$ | 6.4 mm |
| $\theta_2$ | 30 degrees |

The first cup-shaped members 11 and the second cup-shaped members 12 were placed alternately in repetition to obtain a pipe such as shown in FIG. 1 in the compression device shown in FIG. 19. Carbon sheet was inserted to be held between the pipe and the central rod 81. Similarly, another piece of carbon sheet was inserted to be held between the pipe and the cylindrical outer frame 91.

Figure 24:
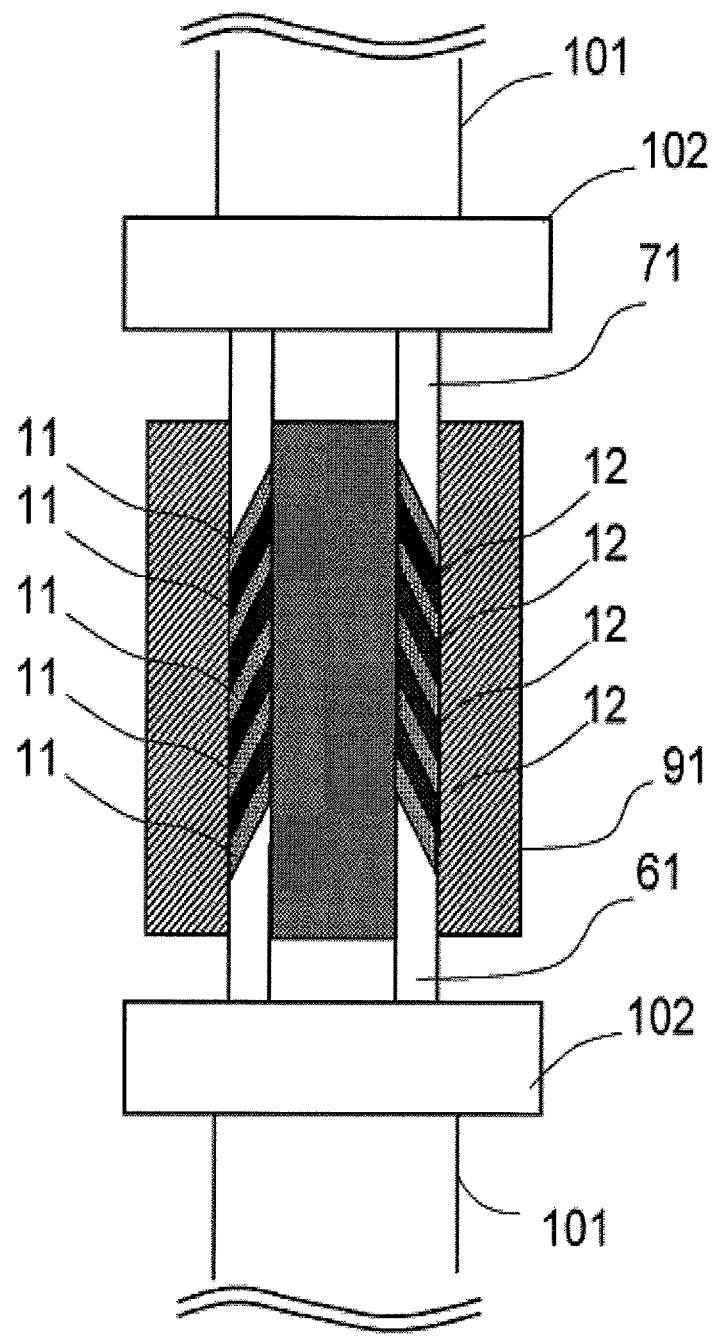
FIG. 24 shows a compression device having a pipe located therein, the pipe including first cup-shaped members and second cup-shaped members 12 placed alternately in repetition.

The pipe was sintered by the spark plasma sintering technique by use of the compression device shown in FIG. 19 (see FIG. 24). The sintering conditions are shown in Table 2. In this manner, a pipe-shaped thermal power generation device was obtained.

TABLE 2

| | |
|---|---|
| Joining temperature | 500° C. |
| Joining time | 5 minutes |
| Pressure | 4.4 kN |
| Degree of vacuum | $3 \times 10^{-3}$ Pa |

The above-described procedure was repeated four times to obtain four thermal power generation devices. The four thermal power generation devices were connected in series by use of solder. Then, both of two ends of the connected body of pipe-shaped thermal power generation devices were cut to obtain a pipe-shaped thermal power generation device having a length of about 110 mm. The first electrode 15 and the second electrode 16 made of indium were respectively attached to both of the two ends of the pipe-shaped thermal power generation device.

As shown in FIG. 12, the resultant pipe-shaped thermal power generation device 981 was immersed in the cold water 983 having a temperature of 10° C. The hot water 984 having a temperature of 90° C. was circulated in the inner through-hole 18. The hot water 984 had a flow rate of 20 liters/minute.

The maximum value of the generated power of the pipe-shaped thermal power generation device 981 was calculated by the following expression:

Maximum value of the generated power=((open circuit voltage between the first electrode 15 and the second electrode 16)/2)²/(the value of the electric resistance between the first electrode 15 and the second electrode 16)

The open circuit voltage is a voltage caused between the first electrode 15 and the second electrode 16 in a state where the temperature difference is applied and no electric current flows.

The value of the electric resistance of the pipe-shaped thermal power generation device 981 is obtained as follows.

First, the voltage caused between the first electrode 15 and the second electrode 16 is measured in a state where a constant electric current is applied between the first electrode 15 and the second electrode 16 with no temperature difference being applied.

Next, the measured voltage is divided by the value of the constant electric current to calculate the value of the electric resistance.

Comparative Example 1

The same experiment as that in Example 1 was performed except that the first cup-shaped members 11 and the second cup-shaped members 12 were sintered under the conditions shown in Table 2 before the first cup-shaped members 11 and the second cup-shaped members 12 were placed alternately in repetition to form a pipe.

In Comparative example 1, it should be noted that the first cup-shaped members 11 and the second cup-shaped members 12 were sintered twice. In other words, the first cup-shaped members 11 and the second cup-shaped members 12 were sintered before the formation of the pipe and were sintered again after the formation of the pipe.

Table 3 shows the results of experiments in Example 1 and Comparative example 1.

TABLE 3

| | Maximum value of the generated power (W) |
|---|---|
| Example 1 | 2.4 |
| Comparative example 1 | 1.0 |

Example 2

The first cup-shaped members 11 and the second cup-shaped members 12 were obtained by use of the compression device shown in FIG. 19. Table 4 shows the details of the first cup-shaped members 11 and the second cup-shaped members 12 in Example 2.

TABLE 4

| | |
|---|---|
| Material of the first cup-shaped members 11 | Aluminum |
| Number of the first cup-shaped members 11 | 8 |
| Particle size of the raw material powder | 45 μm |
| Pressure applied to the raw material powder to obtain the first cup-shaped members 11 | 11 kN |
| $dl_1$ | 14 mm |
| $ds_1$ | 10 mm |
| $h_1$ | 6.4 mm |
| $\theta_1$ | 30 degrees |
| Material of the second cup-shaped members 12 | $Bi_{0.5}Sb_{1.5}Te_3$ |
| Number of the second cup-shaped members 12 | 7 |
| $dl_2$ | 14 mm |
| Particle size of the raw material powder | 75 μm |
| Pressure applied to the material powder to obtain the second cup-shaped members 12 | 11 kN |
| $ds_2$ | 10 mm |
| $h_2$ | 6.4 mm |
| $\theta_2$ | 30 degrees |

Like in Example 1, a pipe such as shown in FIG. 1 was obtained in the compression device shown in FIG. 19.

The pipe was sintered by the spark plasma sintering technique by use of the compression device shown in FIG. 19 (see FIG. 24). The sintering conditions are shown in Table 5. In this manner, a pipe-shaped thermal power generation device was obtained.

TABLE 5

| | |
|---|---|
| Joining temperature | 400° C. |
| Joining time | 5 minutes |

TABLE 5-continued

| | |
|---|---|
| Pressure | 4.4 kN |
| Degree of vacuum | $3 \times 10^{-3}$ Pa |

Comparative Example 2

The same experiment as that in Example 2 was performed except that the first cup-shaped members 11 and the second cup-shaped members 12 were sintered under the conditions shown in Table 5 before the first cup-shaped members 11 and the second cup-shaped members 12 were placed alternately in repetition to form a pipe.

In Comparative example 2, like in Comparative example 1, it should be noted that the first cup-shaped members 11 and the second cup-shaped members 12 were sintered twice.

Table 6 shows the results of experiments in Example 2 and Comparative example 2.

TABLE 6

| | Maximum value of the generated power (W) |
|---|---|
| Example 2 | 0.3 |
| Comparative example 2 | 0.15 |

As is clear from Table 3 and Table 6, the pipe-shaped thermal power generation device obtained by a method of sintering a pipe formed by use of the non-sintered first cup-shaped members 11 and second cup-shaped members 12 has a higher maximum value of the generated power than the pipe-shaped thermal power generation device obtained by a method of re-sintering a pipe formed by use of the sintered first cup-shaped members 11 and second cup-shaped members 12.

Present disclosure provides a novel method for manufacturing a pipe-shaped thermal power generation device having a high maximum value of the generated power. The pipe-shaped thermal power generation device obtained by the method according to present disclosure can have a high maximum value of the generated power.

Embodiments have been described above as an illustration of the technique of the present disclosure. The accompanying drawings and the detailed description are provided for this purpose. Thus, elements appearing in the accompanying drawings and the detailed description include not only those that are essential to solving the technical problems set forth herein, but also those that are not essential to solving the technical problems but are merely used to illustrate the technique disclosed herein. Therefore, those non-essential elements should not immediately be taken as being essential for the reason that they appear in the accompanying drawings and/or in the

DETAILED DESCRIPTION

The embodiments above are for illustrating the technique disclosed herein, and various changes, replacements, additions, omissions, etc., can be made without departing from the scope defined by the claims and equivalents thereto.

What is claimed is:

1. A method for manufacturing a pipe-shaped thermal power generation device, comprising:
step (a) of compressing powder of a metal material to provide a first cup-shaped member made of the metal material, wherein:
the first cup-shaped member has a first inner surface and a first outer surface,
the first cup-shaped member has a first through-hole at a lower end thereof,
the first cup-shaped member has a cross-sectional area which decreases toward the lower end thereof, and
the first cup-shaped member is not sintered;
step (b) of compressing powder of a thermoelectric material to provide a second cup-shaped member made of the thermoelectric material, wherein:
the second cup-shaped member has a second inner surface and a second outer surface,
the second cup-shaped member has a second through-hole at a lower end thereof,
the second cup-shaped member has a cross-sectional area which decreases toward the lower end thereof, and
the second cup-shaped member is not sintered;
step (c) of alternately placing a plurality of said first cup-shaped members and a plurality of said second cup-shaped members in repetition to form a pipe having an inner through-hole, wherein:
each of the plurality of first cup-shaped members is inserted into one second cup-shaped member among two second cup-shaped members adjacent thereto so that the first outer surface of the first cup-shaped member is in contact with the second inner surface of the one second cup-shaped member,
the other second cup-shaped member among the two second cup-shaped members adjacent to the first cup-shaped member is inserted into the first cup-shaped member so that the first inner surface of the first cup-shaped member is in contact with the second outer surface of the other second cup-shaped member,
the inner through-hole is formed by the plurality of first through-holes and the plurality of second through-holes,
the first cup-shaped members are not sintered, and
the second cup-shaped members are not sintered; and
step (d) of sintering the pipe formed in step (c) to obtain the pipe-shaped thermal power generation device, wherein:
while the pipe is sintered, a pressure is applied to the pipe along a longitudinal direction of the pipe in a direction in which the pipe is compressed; wherein:
in step (a), the powder of the metal material is compressed by a compression device; and
step (a) includes:
step (a1)) of preparing the compression device, wherein:
the compression device includes a central rod, a cylindrical outer frame, a first cylindrical inner frame, and a second cylindrical inner frame,
the first cylindrical inner frame and the second cylindrical inner frame face each other along a longitudinal direction of the central rod,
the second cylindrical inner frame is held between the central rod and the cylindrical outer frame,
an outer surface of the central rod is in contact with an inner surface of the second cylindrical inner frame,
an inner surface of the cylindrical outer frame is in contact with an outer surface of the second cylindrical inner frame,
the central rod is longer than the second cylindrical inner frame,
the cylindrical outer frame is longer than the second cylindrical inner frame,
as seen in a cross-section of the compression device taken along the longitudinal direction of the central rod, one of two ends of the second cylindrical inner frame is inclined, and the one end faces the first cylindrical inner frame, as seen in the cross-section of the compression device taken along the longitudinal direction of the central rod, one of two ends of the first cylindrical inner frame is inclined, and the one end faces the second cylindrical inner frame, such that the one inclined end of the first cylindrical inner frame and the one inclined end of the second cylindrical inner frame are parallel to each other;

step (a2) of placing the powder of the metal material at the one end of the second cylindrical inner frame such that the powder of the metal material is held between the central rod and the cylindrical outer frame; and step (a3) of inserting the first cylindrical inner frame into a space between the central rod and the cylindrical outer frame along the longitudinal direction of the central rod to compress the powder of the metal material between the first cylindrical inner frame and the second cylindrical inner frame.

2. A method for manufacturing a pipe-shaped thermal power generation device, comprising:

step (a) of compressing powder of a metal material to provide a first cup-shaped member made of the metal material, wherein:
the first cup-shaped member has a first inner surface and a first outer surface,
the first cup-shaped member has a first through-hole at a lower end thereof,
the first cup-shaped member has a cross-sectional area which decreases toward the lower end thereof, and
the first cup-shaped member is not sintered;

step (b) of compressing powder of a thermoelectric material to provide a second cup-shaped member made of the thermoelectric material, wherein:
the second cup-shaped member has a second inner surface and a second outer surface,
the second cup-shaped member has a second through-hole at a lower end thereof,
the second cup-shaped member has a cross-sectional area which decreases toward the lower end thereof, and
the second cup-shaped member is not sintered;

step (c) of alternately placing a plurality of said first cup-shaped members and a plurality of said second cup-shaped members in repetition to form a pipe having an inner through-hole, wherein:
each of the plurality of first cup-shaped members is inserted into one second cup-shaped member among two second cup-shaped members adjacent thereto so that the first outer surface of the first cup-shaped member is in contact with the second inner surface of the one second cup-shaped member,
the other second cup-shaped member among the two second cup-shaped members adjacent to the first cup-shaped member is inserted into the first cup-shaped member so that the first inner surface of the first cup-shaped member is in contact with the second outer surface of the other second cup-shaped member,
the inner through-hole is formed by the plurality of first through-holes and the plurality of second through-holes,
the first cup-shaped members are not sintered, and
the second cup-shaped members are not sintered; and step (d) of sintering the pipe formed in step (c) to obtain the pipe-shaped thermal power generation device, wherein:
while the pipe is sintered, a pressure is applied to the pipe along a longitudinal direction of the pipe in a direction in which the pipe is compressed; wherein:

in step (b), the powder of the thermoelectric material is compressed by a compression device; and step (b) includes:
step (b1) of preparing the compression device, wherein:
the compression device includes a central rod, a cylindrical outer frame, a first cylindrical inner frame, and a second cylindrical inner frame,
the first cylindrical inner frame and the second cylindrical inner frame face each other along a longitudinal direction of the central rod,
the second cylindrical inner frame is held between the central rod and the cylindrical outer frame,
an outer surface of the central rod is in contact with an inner surface of the second cylindrical inner frame,
an inner surface of the cylindrical outer frame is in contact with an outer surface of the second cylindrical inner frame,
the central rod is longer than the second cylindrical inner frame,
the cylindrical outer frame is longer than the second cylindrical inner frame,
as seen in a cross-section of the compression device taken along the longitudinal direction of the central rod, one of two ends of the second cylindrical inner frame is inclined, and the one end faces the first cylindrical inner frame,
as seen in the cross-section of the compression device taken along the longitudinal direction of the central rod, one of two ends of the first cylindrical inner frame is inclined, and the one end faces the second cylindrical inner frame, such that the one inclined end of the first cylindrical inner frame and the one inclined end of the second cylindrical inner frame are parallel to each other;

step (b2) of placing the powder of the thermoelectric material at the one end of the second cylindrical inner frame such that the powder of the thermoelectric material is held between the central rod and the cylindrical outer frame; and step (b3) of inserting the first cylindrical inner frame into a space between the central rod and the cylindrical outer frame along the longitudinal direction of the central rod to compress the powder of the thermoelectric material between the first cylindrical inner frame and the second cylindrical inner frame.

* * * * *